US011175757B2

(12) United States Patent
Ho et al.

(10) Patent No.: US 11,175,757 B2
(45) Date of Patent: Nov. 16, 2021

(54) LIGHT EMITTING TOUCHPAD DEVICE

(71) Applicant: CHICONY POWER TECHNOLOGY CO., LTD., New Taipei (TW)

(72) Inventors: Hsuan-Wei Ho, New Taipei (TW); Yueh-Heng Lee, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/809,864

(22) Filed: Mar. 5, 2020

(65) Prior Publication Data

US 2020/0301523 A1  Sep. 24, 2020

Related U.S. Application Data

(60) Provisional application No. 62/821,110, filed on Mar. 20, 2019.

(30) Foreign Application Priority Data

Jan. 8, 2020 (TW) .................. 109100663

(51) Int. Cl.
*G06F 3/0354* (2013.01)
*H05K 1/02* (2006.01)
*G06F 3/042* (2006.01)

(52) U.S. Cl.
CPC ........ *G06F 3/03547* (2013.01); *G06F 3/0421* (2013.01); *H05K 1/0274* (2013.01); *G06F 2203/04103* (2013.01)

(58) Field of Classification Search
CPC ............... G06F 3/03547; G06F 3/0421; G06F 2203/04103; H05K 1/0274
See application file for complete search history.

(56) References Cited

U.S. PATENT DOCUMENTS

| 9,118,036 B2 | 8/2015 | Kim |
| 9,581,754 B2 | 2/2017 | Shibata |
| 10,048,792 B1 * | 8/2018 | Schediwy ............. G06F 3/0414 |

(Continued)

FOREIGN PATENT DOCUMENTS

| CN | 101770306 A | 7/2010 |
| CN | 101751176 B | 6/2013 |

(Continued)

*Primary Examiner* — Kent W Chang
*Assistant Examiner* — Andrew Lee
(74) *Attorney, Agent, or Firm* — Muncy, Geissler, Olds & Lowe, P.C.

(57) ABSTRACT

The present disclosure discloses a light emitting touch pad device including a circuit board, a plurality of sensing elements, a light guiding plate, a light emitting component, and a plurality of first spacing blocks. The sensing elements are disposed on the circuit board, and a distance between geometric centers of two adjacent sensing elements is a first length. The light guiding plate is disposed above the circuit board, and includes at least one light spot area and at least one nil-light spot area. The light emitting component emits light toward the light guiding plate. The first spacing blocks are disposed on the light guiding plate, and are located in the nil-light spot area. A distance between geometric centers of two adjacent first spacing blocks is a second length, and a spacing distance between two adjacent first spacing blocks is a third length.

20 Claims, 8 Drawing Sheets

(56) References Cited

U.S. PATENT DOCUMENTS

| | | | |
|---|---|---|---|
| 10,317,578 B2 | 6/2019 | Sarma et al. | |
| 2004/0228113 A1* | 11/2004 | Wang | G02B 6/0055 |
| | | | 362/631 |
| 2010/0271839 A1* | 10/2010 | Chan | H01H 13/83 |
| | | | 362/602 |
| 2011/0079497 A1* | 4/2011 | Ng | H01H 13/85 |
| | | | 200/314 |
| 2013/0127790 A1* | 5/2013 | Wassvik | G06F 3/0428 |
| | | | 345/175 |
| 2014/0340591 A1 | 11/2014 | Chang et al. | |
| 2014/0354596 A1 | 12/2014 | Djordjev et al. | |
| 2015/0185906 A1* | 7/2015 | Park | G06F 3/044 |
| | | | 345/174 |
| 2016/0070416 A1 | 3/2016 | Wassvik | |
| 2016/0336128 A1* | 11/2016 | Leong | H01H 13/702 |

FOREIGN PATENT DOCUMENTS

| | | |
|---|---|---|
| CN | 204143653 U | 2/2015 |
| CN | 106489123 A | 3/2017 |
| CN | 109388293 A | 2/2019 |
| CN | 109478113 A | 3/2019 |
| TW | I222036 B | 10/2004 |
| TW | 201205149 A1 | 2/2012 |
| TW | I446215 B | 7/2014 |
| TW | 201712379 A | 4/2017 |
| TW | I582706 B | 5/2017 |
| TW | I639108 B | 10/2018 |
| WO | WO2016172917 A1 | 11/2016 |

\* cited by examiner

LIGHT EMITTING TOUCHPAD DEVICE

BACKGROUND

1. Technical Field

The present disclosure relates to a touchpad device, and more particularly to a light emitting touchpad device.

2. Description of the Related Art

A conventional touchpad does not provide a light emitting effect, but usually has purely a trajectory input mode and is used in substitution for an input function of a mouse. In order to satisfy various input modes, an application of a novel touchpad, i.e., a lighting touchpad (herein referred to as a light emitting touchpad device) combining a touchpad and a backlight module, has become commercially available. Taking, present light emitting touchpad devices for instance, when not emitting light, each light emitting touchpad device performs a common touchpad mode (trajectory detection), such as being used for manipulating a mouse cursor; when emitting light, each light emitting touchpad device reveals a specific pattern, and performs a function corresponding to the specific pattern, such as displaying a numeric keypad and performing a tap input mode. Obviously the specific pattern is usually the location of a light emitting area of each light emitting touchpad device.

A light emitting touchpad mostly consists of films stacked in multiple layers and a circuit board provided with a light emitting component, and the stacked layers are usually bound by glue in between. In order to meet sensing requirements of touchpad (that is, preventing misjudgment issues of a touch control system), glue is applied in full range of an area that light emission is not needed (that is, an area without the specific pattern), such that the surface of the touchpad maintains evenness and is unlikely deformed under the pressing of a user, so as to prevent inconsistency of touch sensing signals.

However, using glue in full range of the area would degrade the efficiency of total light emission of the light emitting touchpad. Specifically, if a film for guiding light is directly applied by an adhesive, an effect similar to optical dots would be produced (that is, the conditions for total inner reflection of light propagating within the film are changed). On the basis of conservation of energy, if part energy of light is consumed in the glue-applied area, the luminance of a light emitting pattern on the touchpad would be attenuated.

SUMMARY

In view of the above issues, it is a major object of the present disclosure to provide a light emitting touchpad device, which includes a plurality of spacing blocks disposed on a light guiding plate. With the special configuration of the spacing blocks, the problem of the unsatisfactory light-emission efficiency of a conventional light emitting touchpad device can be solved.

To achieve the above object, the present disclosure provides a light emitting touchpad device including a circuit board, a plurality of sensing elements, a light guiding plate, a light emitting component, a plurality of first spacing blocks and a control unit. The sensing elements are disposed on the circuit board, and a distance between geometric centers of two adjacent sensing elements is a first length. The light guiding plate is disposed above the circuit board, and includes at least one light spot area, at least one nil-light spot area, a bottom surface and a top surface. A plurality of light spots are disposed in the light spot area, and no light spots are disposed in the nil-light spot area. The bottom surface faces the circuit board, and the top surface is located on a side opposite to the bottom surface. The light emitting component is disposed adjacent to the light guiding plate and emits light toward the light guiding plate. The first spacing blocks are disposed on the bottom surface or the top surface of the light guiding plate and located in the nil-light spot area. A distance between geometric centers of two adjacent first spacing blocks is a second length, and a spacing distance between two adjacent first spacing blocks is a third length. The control unit is electrically connected to the sensing elements and the light emitting component.

According to an embodiment of the present disclosure, the light guiding plate includes a plurality of light spot areas and a plurality of nil-light spot areas. The light spots in at least one light spot area among the light spot areas are arranged in a specific pattern, and the specific pattern is used for identification by a user.

According to an embodiment of the present disclosure, the light emitting touchpad device further includes a plurality of second spacing blocks. The first spacing blocks are disposed on the bottom surface, and the second spacing blocks are disposed on the top surface. A distance between geometric centers of two adjacent second spacing blocks is the second length, and a spacing distance between two adjacent second spacing blocks is the third length.

According to an embodiment of the present disclosure, a geometric center of any one second spacing block is aligned with a geometric center of one of the first spacing blocks.

According to an embodiment of the present disclosure, a geometric center of any one first spacing block is aligned with a geometric center of one of the sensing elements.

According to an embodiment of the present disclosure, the second length is less than or equal to twice the first length.

According to an embodiment of the present disclosure, the third length is less than a fourth length. The fourth length is a diameter of a cylindrical test rod or a maximum dimension of a surface of an open end of a non-cylindrical test rod.

According to an embodiment of the present disclosure, the light emitting touchpad device further includes a reflective plate. The reflective plate is disposed between the circuit board and the light guiding plate. The first spacing blocks are located between the light guiding plate and the reflective plate and support the light guiding plate.

According to an embodiment of the present disclosure, the circuit board further includes a plurality of protrusions, and the light emitting touchpad device further includes a plurality of air discharging blocks. The air discharging blocks are disposed between the reflective plate and the circuit board and are respectively located at the protrusions.

According to an embodiment of the present disclosure, the light emitting touchpad device further includes a black mask and a contact plate. The black mask is located above the light guiding plate, and the second spacing blocks are located between the black mask and the light guiding plate and support the black mask. The contact plate is disposed above the black mask.

According to an embodiment of the present disclosure, each of the first spacing blocks is a flexible block formed by solidified glue.

According to an embodiment of the present disclosure, the light emitting touchpad device further includes at least one filling block. The filling block is disposed in a gap between two adjacent first spacing blocks, and connects the two adjacent first spacing blocks. The filling block is a flexible block formed by solidified glue.

As described above, the light emitting touchpad device according to the present disclosure includes a plurality of first spacing blocks provided on a light guiding plate and located in a nil-light spot area. The distance between the geometric centers of two adjacent first spacing blocks is a second length, and the spacing distance between two adjacent first spacing blocks is a third length. In other words, the first spacing blocks are disposed in a manner of intervals in the nil-light spot area of the light guiding plate and are capable of reducing a loss of light energy, thereby achieving an effect of enhancing an overall efficiency of light emission of the light emitting touchpad device.

Further, in some embodiments, by designing the spacing distance between two adjacent first spacing blocks (e.g., the third length) to be less than the diameter of a cylindrical test rod (e.g., the fourth length) or the maximum dimension of the surface of an open end of a non-cylindrical test rod (e.g., another fourth length), or by designing the distance between the geometric centers of two adjacent first spacing blocks (e.g., the second length) to be less than the twice the distance between the geometric centers of the two adjacent sensing elements (e.g., the first length), the effect of enhancing the overall efficiency of light emission of the light emitting touchpad device and the effect of preventing touch control system from misjudgment can be simultaneously achieved.

DETAILED DESCRIPTION OF THE EMBODIMENTS

Hereafter, the technical content of the present disclosure will be better understood with reference to preferred embodiments.

Figure 1:
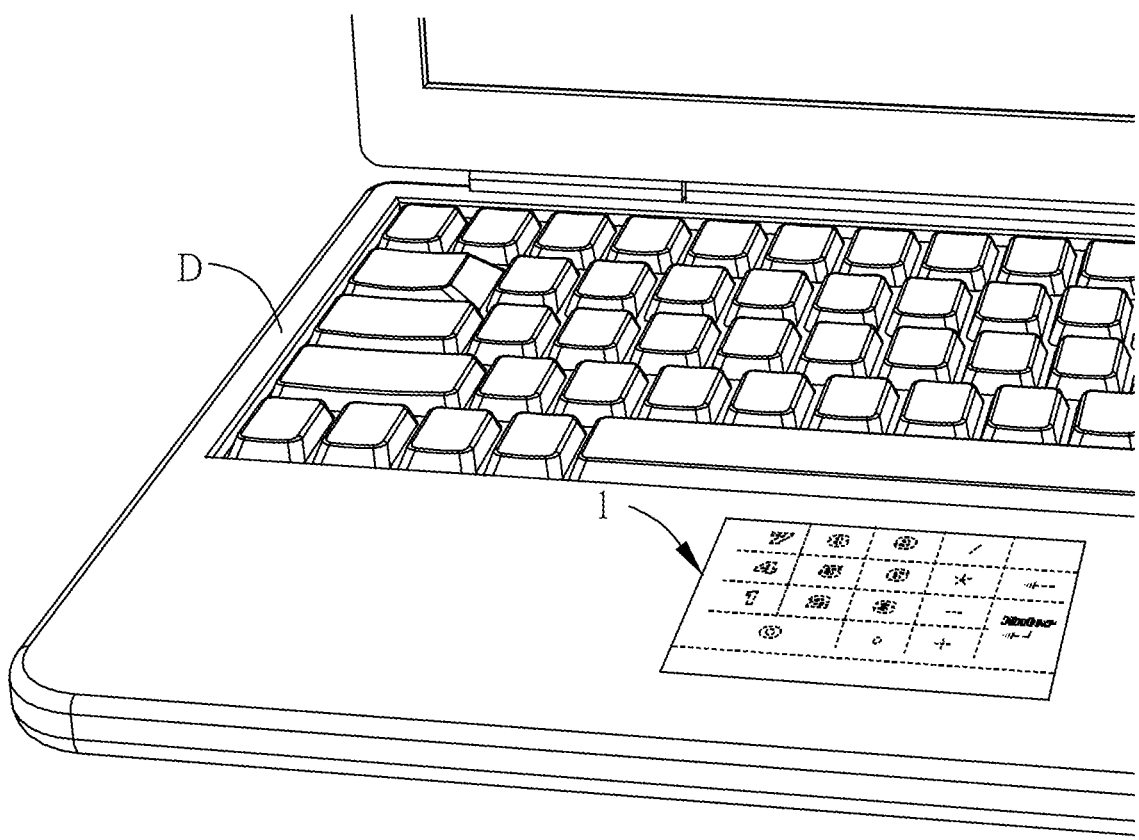
FIG. 1 is a schematic perspective view of a light emitting touchpad device applied to a portable electronic device according to an embodiment of the present disclosure.
Figure 2:
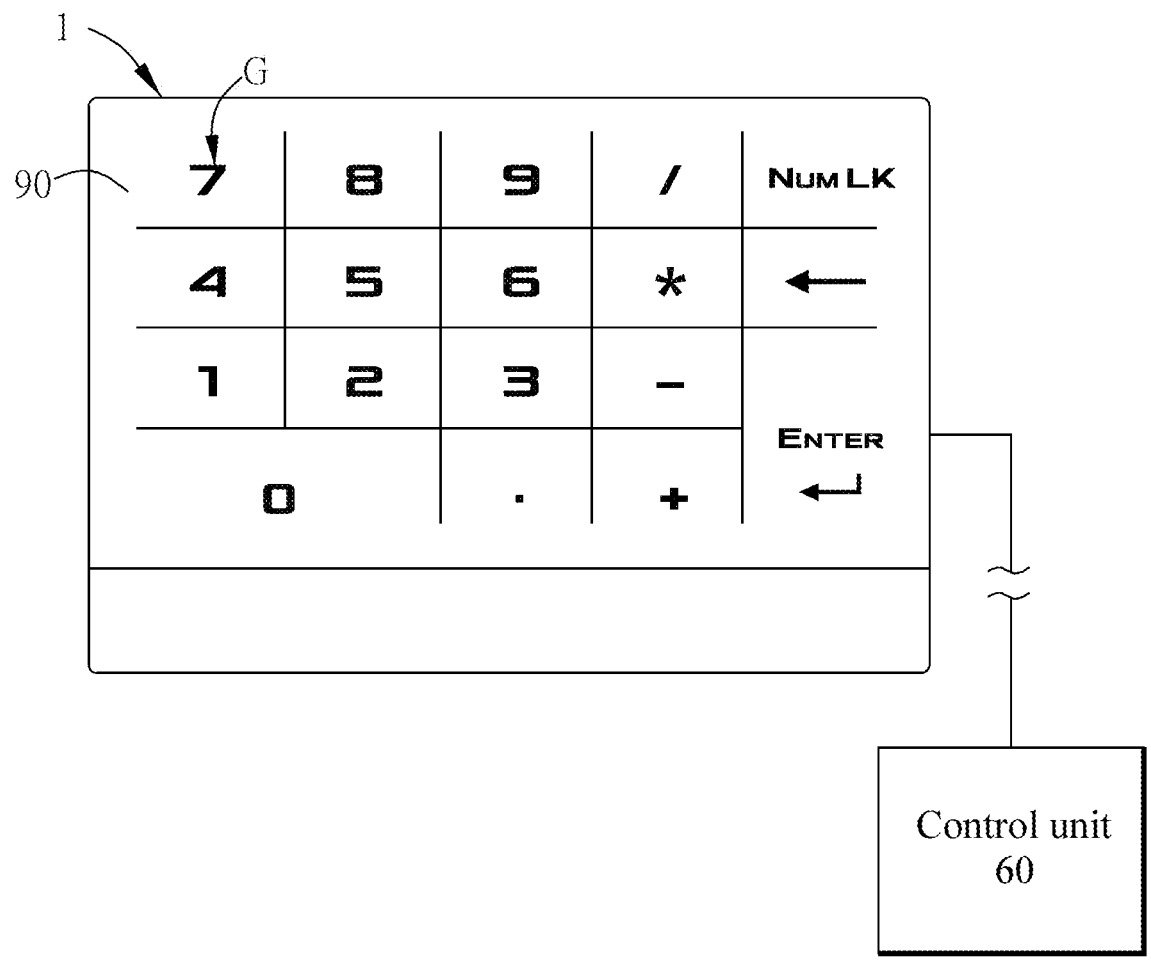
FIG. 2 is a schematic top view of the light emitting touchpad device shown in FIG. 1.
Figure 3:
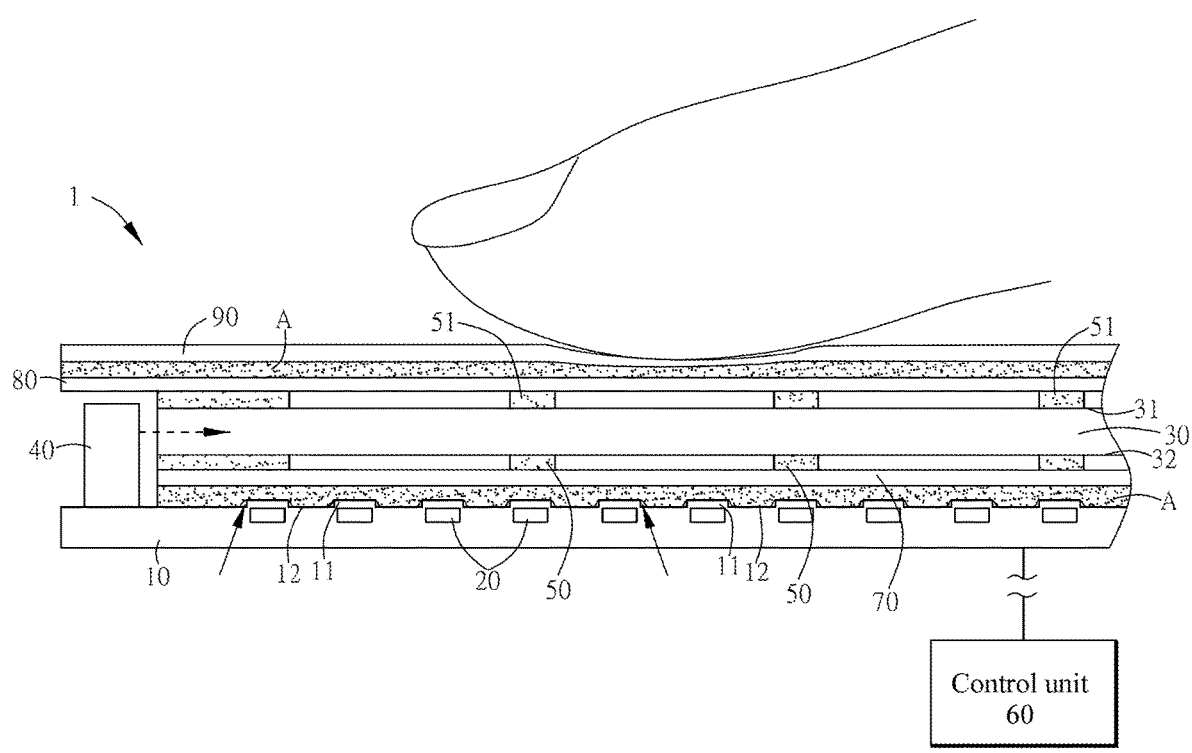
FIG. 3 is a schematic partial sectional view of the light emitting touchpad device shown in FIG. 2 being touched by a user's finger.
Figure 4:
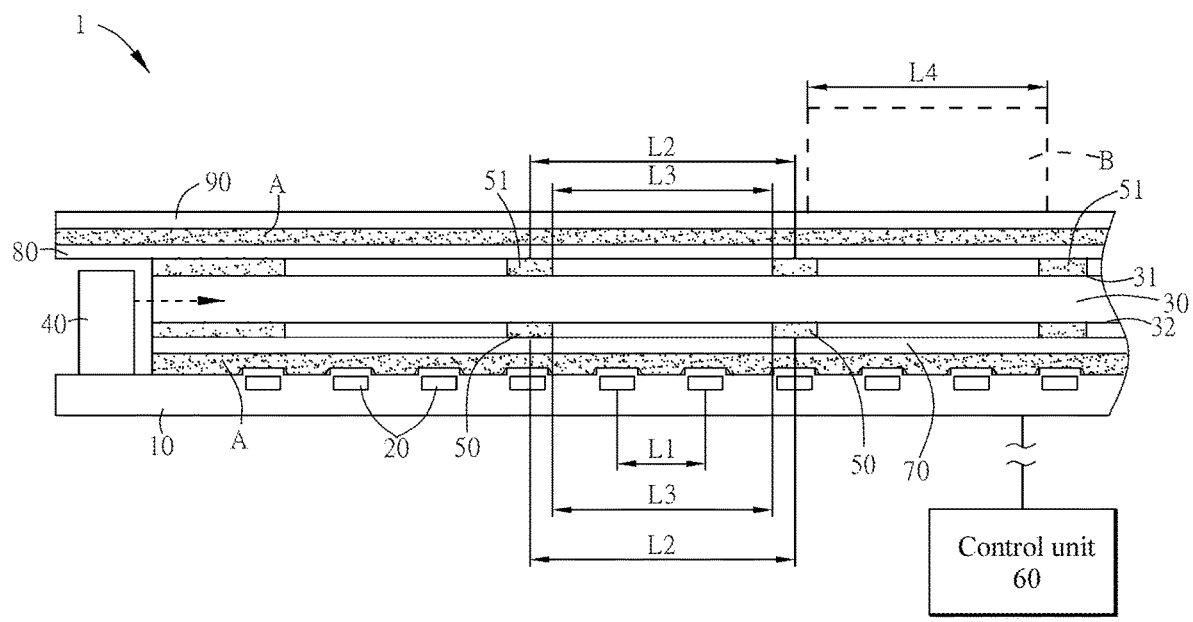
FIG. 4 is a schematic partial sectional view of the light emitting touchpad device shown in FIG. 2 being touched by a metal test rod.
Figure 5:
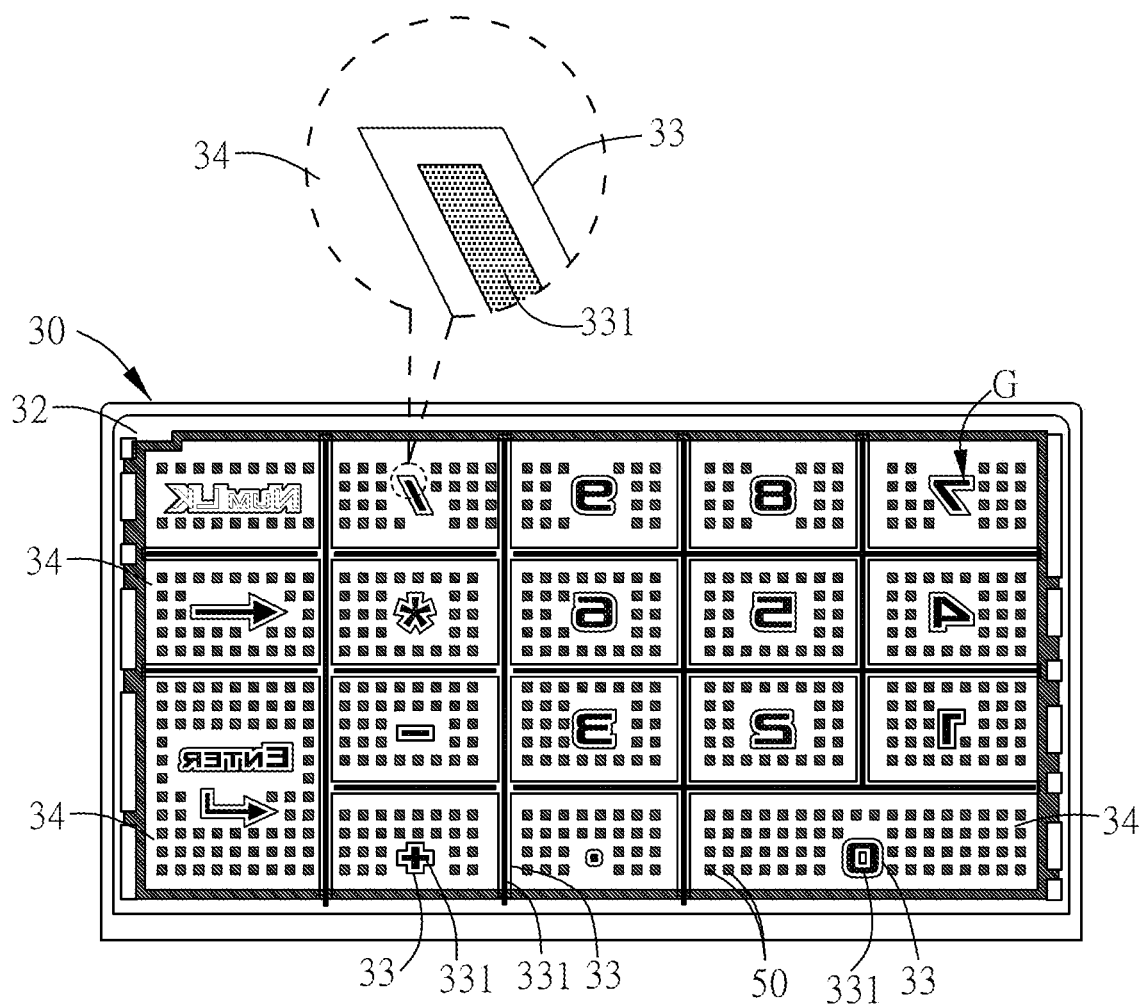
FIG. 5 is a schematic bottom view of a light guiding plate and first spacing blocks of the light emitting touchpad device shown in FIG. 2.

FIG. 1 shows a schematic perspective view of a light emitting touchpad device applied to a portable electronic device according to an embodiment of the present disclosure. FIG. 2 shows a schematic top view of the light emitting touchpad device shown in FIG. 1. FIG. 3 shows a schematic partial sectional view of the light emitting touchpad device shown in FIG. 2 being touched by a user's finger. FIG. 4 shows a schematic partial sectional view of the light emitting touchpad device shown in FIG. 2 being touched by a metal test rod. FIG. 5 shows a schematic bottom view of a light guiding plate and first spacing blocks of the light emitting touchpad device shown in FIG. 2. Refer to FIG. 1 to FIG. 5. In this embodiment, a light emitting touchpad device 1 can be applied as a touchpad of a portable electronic device D (e.g., a laptop computer), and can perform at least two different input modes, for example, a default input mode (e.g., trajectory detection) for manipulating a mouse cursor, and a specific input mode corresponding to a specific pattern G displayed by the light emitting touchpad device 1, such as a tap input mode corresponding to a numeric keypad pattern shown in FIG. 2 (i.e., the specific pattern G, to be further described later).

As shown in FIG. 2 and FIG. 3, the light emitting touchpad device 1 of the embodiment includes a circuit board 10, a plurality of sensing elements 20, a light guiding plate 30, a light emitting component 40, a plurality of first spacing blocks 50 and a control unit 60. The sensing elements 20 and the light emitting component 40 are disposed on the circuit board 10. The control unit 60 is electrically connected to the sensing elements 20 and the light emitting component 40, such that the control unit 60 receives sensing signals sent by the sensing elements 20, and controls the light emitting component 40 to emit light according to the input mode performed by the light emitting touchpad device 1. Further, the control unit 60 can be disposed in a portable electronic device D (e.g., a motherboard system in the portable electronic device D) or be disposed on the circuit board 10 (e.g., a microcontroller chip on the circuit board 10), and is not specifically limited by the present disclosure. Therefore, the control units 60 depicted in FIG. 2, FIG. 3 and FIG. 4 are simply represented by diagrammatic boxes, respectively.

In this embodiment, the sensing elements 20 are arranged in equidistant spacing. For example, a distance between two geometric centers of two adjacent sensing elements 20 is a first length L1 (as shown in FIG. 4) Preferably, the plurality of sensing elements 20 are arranged in form of a two-dimensional array on the circuit board 10, and each sensing element 20 can be a capacitive sensor. When an object carrying electric charge becomes close to the circuit board 10, for example, when a finger (an electrically charged object) touches the light emitting touchpad device 1, the sensing element 20 which is closer to the finger produces an induced current as a result of enduring an electric field, and then the sensing element 20 sends a sensing signal corresponding to the value of the sensing current to the control unit 60. The control unit 60 accordingly learns the position touched by the finger from the sensing signal, and establishes a connection with a program of the input mode which is currently executed by the portable electronic device D, so as to run a corresponding process (e.g., manipulating a mouse cursor displayed on a screen).

As shown in FIG. 4 and FIG. 5, the light guiding plate 30 is disposed above the circuit board 10. The light emitting component 40 of this embodiment is disposed adjacent to a side edge of the light guiding plate 30, and emits light toward the light guiding plate 30. The light guiding plate 30 of this embodiment includes a top surface 31, a bottom surface 32, at least one light spot area 33, and at least one nil-light spot area 34. In this embodiment, the light guiding plate 30 including a plurality of light spot areas 33 and a plurality of nil-light spot areas 34 is taken as an example for illustration purposes. The bottom surface 32 faces the circuit board 10, and the top surface 31 is located on the side opposite to the bottom surface 32, in which the top surface 31 is a light exiting surface. It should be noted that, FIG. 3 and FIG. 4 are schematic partial sectional views corresponding to the nil-light spot areas 34, and the light spot areas 33 are not depicted in FIG. 3 and FIG. 4. FIG. 5 is a schematic bottom view of looking upward from the side where the bottom surface 32 is located, and thus the specific pattern G depicted in FIG. 5 seems to be horizontally flipped from that depicted in FIG. 2. A plurality of light spots 331 are disposed in the light spot area 33, and form an optical-dot structure in a dense arrangement (referring to the partial enlarged view in FIG. 5). Further, the light spots 331 are arranged to form the specific pattern G, and thus the specific pattern G shown in FIG. 5 is represented in solid black. The light spots 331 can be disposed on the top surface 31 or the bottom surface 32, and are not limited by the present disclosure. Each of the light spots 331 can be a dot formed by printed ink, or can be a microstructure formed by roughening the surface of the light guiding plate 30, such as a microstructure protruding outward from the surface and a microstructure recessing inward from the surface, so as to cancel the conditions of total inner reflection while the light propagates inside the light guiding plate 30. Once the light emitted by the light emitting component 40 reaches the light spot area 33, a part of the light is guided toward the top surface 31 (i.e., the light exiting surface) by the light spots 331. Because the light spots 331 sabotage the total inner reflection of the part of the light, thus the part of the light would change its propagation direction toward the top surface 31.

That is to say, only an area distributed with the light spots 331 (i.e., the light spot area 33) presents a visual effect of light emission. In this embodiment, the light spots 331 in at least one light spot area 33 among the plurality of light spot areas 33 are arranged to present the foregoing specific pattern G, such as numerals, operands, arrows and characters, as shown in FIG. 2. In other words, when the arrangement of the light spots 331 within a part of the light spot areas 33 present the specific pattern G (e.g., numerals, operands, arrows or characters). In the tap input mode, the control unit 60 controls the light emitting component 40 to emit light, such that the light enters the light guiding plate 30, arrives at the light spots 331, and is guided toward the top surface 31 (i.e., the light exiting surface), enabling the specific pattern G to present a light-emitting effect and allowing a user to identify the location of a (virtual) key on the touchpad. In contrast, no light spots 331 are disposed in the nil-light areas 34, hence the nil-light spot areas 34 do not provide any light-emitting effect.

As shown in FIG. 4 and FIG. 5, the first spacing blocks 50 of this embodiment are located in the nil-light spot areas 34. Further, the first spacing blocks 50 can be disposed on the bottom surface 32 or the top surface 31 of the light guiding plate 30, and are not limited by the present disclosure. In this embodiment, the first spacing blocks 50 are located on the bottom surface 32 for instance. In this embodiment, a distance between geometric centers of two adjacent first spacing blocks 50 is a second length L2, and a spacing distance between two adjacent first spacing blocks 50 is a third length L3. In other words, the first spacing blocks 50 are separately arranged in the nil-light spot areas 34 of the light guiding plate 30. In this embodiment, each of the first spacing blocks 50 is a flexible block formed by solidified glue. More specifically, several techniques, such as mesh printing, can be used for the bottom surface 32 or the top surface 31 of the light guiding plate 30 to periodically apply an adhesive, such as the glue that would become flexible after solidifying, and then each of the first spacing blocks 50 can be formed after solidifying the adhesive.

Further, the first spacing blocks 50 can be used as a connecting (propping) means between a film and another film. Specifically, the light emitting touchpad device 1 of this embodiment further includes a reflective plate 70, which is disposed between the circuit board 10 and the light guiding plate 30. The reflective plate 70 and the circuit board 10 of this embodiment are connected by an adhesive layer A formed by an adhesive (e.g., glue) which is applied in full range between the reflective plate 70 and the circuit board 10, and the reflective plate 70 and the light guiding plate 30 are connected by the first spacing blocks 50. More specifically, the first spacing blocks 50 are located between the light guiding plate 30 and the reflective plate 70, and they connect the reflective plate 70 with the light guiding plate 30 and support the light guiding plate 30. The reflective plate 70 can reflect the light refracted from the bottom surface 32 of the light guiding plate 30 back into the light guiding plate 30, so as to enhance the utilization rate of light energy.

In general, the films (e.g., the light guiding plate 30 and the reflective plate 70) are connected to each other by an adhesive, such as glue, which is flexible after solidifying. To satisfy sensing requirements of a touchpad (i.e., maintaining surface evenness so as to prevent system from misjudgment), in the prior art, glue is applied in full range of the nil-light spot areas 34 of the light guiding plate 30 (forming a result similar to the adhesive layer A described above); however, the original conditions for total inner reflection of the light propagating in the light guiding plate 30 would be sabotaged due to the glue. As a result, besides affecting the light propagation in the light guiding plate 30, the loss of light energy is also increased, hence lowering the overall efficiency of light emission of the light emitting touchpad device 1. In this embodiment, the first spacing blocks 50 are arranged in a manner of intervals in the nil-spot areas 34 of the light guiding plate 30. Thus, not only the binding function between the light guiding plate 30 and the reflective plate 70 is kept, but also the loss of light energy is reduced, because the distributed area of the first spacing blocks 50 is significantly less than the area of the glue applied in full range. Therefore, since the loss of light energy is reduced, the overall efficiency of light emission of the light emitting touchpad device 1 is effectively enhanced.

Preferably, the light emitting touchpad device 1 further includes a black mask 80 and a contact plate 90. The black mask 80 is disposed above the light guiding plate 30, and the contact plate 90 is disposed above the black mask 80. The material of the contact plate 90 can be Mylar, glass or other materials that are suitable as a surface of a touchpad, and is not limited by the present disclosure. Further, the black mask 80 and the contact plate 90 can be bound together by an adhesive applied in full range between the black mask 80 and the contact plate 90 (forming another adhesive layer A, as shown in FIG. 4), and the black mask 80 and the light guiding plate 30 are connected by second spacing blocks 51 (described later). In some other embodiments, the black mask 80 can be directly formed on one surface of the contact plate 90 which is toward the light guiding plate 30 by means of printed ink. Thus, the upper one of the two adhesive layers A can be omitted. More specifically, the light emitting touchpad device 1 of this embodiment further includes a plurality of second spacing blocks 51 disposed on the top surface 31 of the light guiding plate 30, such that the second spacing blocks 51 are located between the black mask 80 and the light guiding plate 30. Accordingly, the second spacing blocks 51 connect the black mask 80 with the light guiding plate 30, and the second spacing blocks 51 support the black mask 80. Preferably, the configuration of the second spacing blocks 51 is substantially the same as that of the first spacing blocks 50. For example, a distance between geometric centers of two adjacent second spacing blocks 51 is the second length L2, and a spacing distance between two adjacent second spacing blocks 51 is the third length L3. In other words, the second spacing blocks 51 are separately arranged on the top surface 31 of the light guiding plate 30. Similar to the first spacing blocks 50, because the distributed area of the second spacing blocks 51 is also significantly less than the area of the glue applied in full range, the loss of light energy can be further reduced, as well as effectively enhancing the overall efficiency of light emission of the light emitting touchpad device 1.

Preferably, the geometric center of any one first spacing block 50 is aligned with the geometric center of one of the sensing elements 20. In general, if the spacing distance between the first spacing blocks 50 (e.g., the third length L3) is greater than a scale of a contacted area of a user's finger (usually described as a width of a user's fingertip) while the user performs a touch-control input action, a misjudgment in the touch control system may occur. For example, if the user just exactly presses over a gap between two second spacing blocks 51/first spacing blocks 50, the recessed and deformed level of the contact plate 90 may be relatively large, such that the sensing elements 20 beneath the periphery of the gap (which are supposed not to respond) would also generate touch signals with similar intensities to the sensing element 20 right below the gap and the touch control system would fail to accurately determine the exact location pressed by the user's finger. In view of the above issue, during a phase of quality detection of a light emitting touchpad device 1, a cylindrical metal test rod or a non-cylindrical metal test rod B (e.g., a tapered square-tower-shaped rod) is frequently used to perform a standard test of touch accuracy. In this embodiment, a maximum dimension of a surface of an open end of the non-cylindrical metal test rod B is defined as a fourth length L4, as shown in FIG. 4. In other embodiments, using a cylindrical metal test rod for a test of touch accuracy, a diameter of the cylindrical metal test rod can be defined as the fourth length L4.

Therefore, to simultaneously achieve the optimization of enhancing efficiency of light emission and preventing touch control system from misjudgment, the third length L3 is designed to be less than the fourth length L4 in the light emitting touchpad device 1. In other words, in this embodiment, the first spacing blocks 50 are arranged in a manner of intervals and the spacing distance between two adjacent first spacing blocks 50 (i.e., the third length L3) is designed to be less than the maximum dimension of the surface of the open end of the non-cylindrical metal test rod B (i.e., the fourth length L4), so as to simultaneously achieve the results of enhancing the overall efficiency of light emission of the light emitting touchpad device 1 and preventing the touch control system from misjudgment. Preferably, the second spacing blocks 51 can also be configured by using the similar configuration mentioned above. For example, the geometric center of any one second spacing block 51 can be aligned with the geometric center of one of the first spacing blocks 50, and hence the spacing distance of two adjacent second spacing blocks 51 (which is the third length L3) is similarly less than the maximum dimension of the surface of the open end of the non-cylindrical metal test rod B (i.e., the fourth length L4), as shown in FIG. 4.

Figure 6:
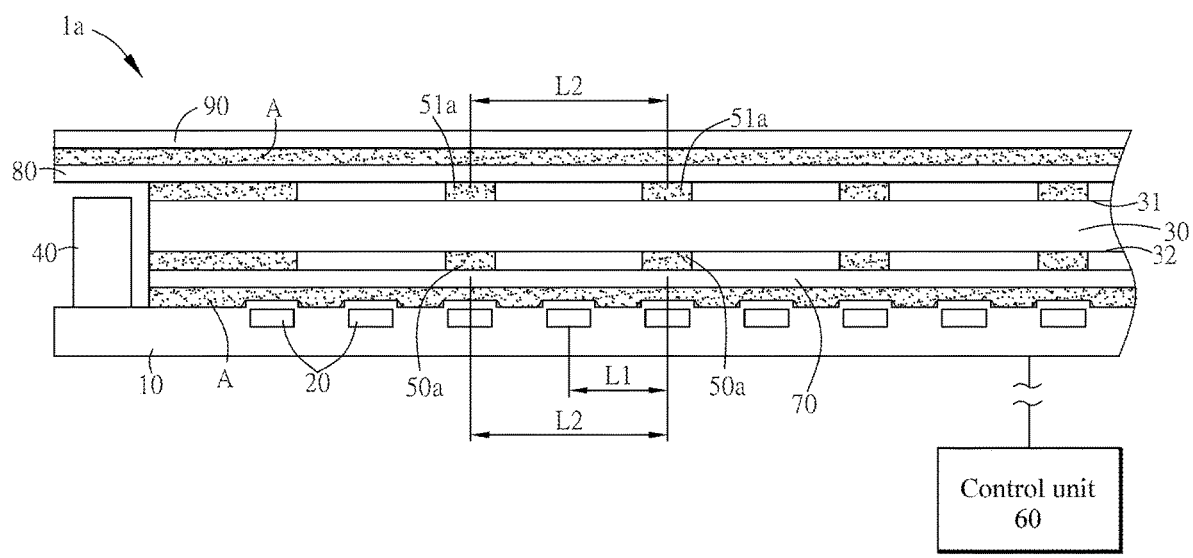
FIG. 6 is a schematic partial sectional view of a light emitting touchpad device according to another embodiment of the present disclosure.

FIG. 6 shows a schematic partial sectional view of a light emitting touchpad device according to another embodiment of the present disclosure. Referring to FIG. 6, first of all, a light emitting touchpad device 1a of this embodiment differs from the foregoing embodiment in the configurations (e.g., spacing distances) of first spacing blocks 50a and second spacing blocks 51a, while the denotations of other components are the same as those of the foregoing embodiment. In this embodiment, the second length L2 (a distance between geometric centers of two adjacent first spacing blocks 50a or a distance between geometric centers of two adjacent second spacing blocks 51a) is less than or equal to twice the first length L1 (a distance between geometric centers of two adjacent sensing elements 20). In other words, the first spacing blocks 50a and the second spacing blocks 51a of this embodiment are arranged much more densely, such that gaps between two adjacent first spacing blocks 50a and gaps between two adjacent second spacing blocks 51a are much smaller than those in the foregoing embodiment, so as to reinforce the suppression of the recessed and deformed level of the contact plate 90 pressed by a user's finger, thereby more thoroughly eliminating misjudgment of a touch control system with respect to determining the locations of the user's finger. That is to say, with designing and planning the second length L2, the touch accuracy of the light emitting touchpad device 1a can be further adjusted.

As shown in FIG. 3, In general, due to the circuit wiring and routing or the distribution of components of the circuit board 10, the surface of the circuit board 10 would appear numerous uneven and bumpy structures. Thus, in this embodiment, the circuit board 10 includes a plurality of protrusions 11 (usually having wires or components underneath) and a plurality of recesses 12 located between the protrusions 11. Since the reflective plate 70 and the circuit board 10 are connected by an adhesive (e.g., glue) applied in full range between the reflective plate 70 and the circuit board 10, some air bubbles are inevitably contained therein during the binding procedure of the reflective plate 70 and the circuit board 10. The contained air initially appears as tiny bubbles randomly distributed throughout the corners of the recesses 12, as indicated by the arrow signs illustrated in FIG. 3. However, as the glue is usually a material that softens upon encountering heat, after the light emitting touchpad device 1 is used by a user for a long period of time (for example, the heat produced by rubbing fingers or the waste heat from the operation of the portable electronic device D aggravates the softening of the glue), the tiny bubbles originally scattered around the recesses 12 become gathered forming several air bubbles in relatively larger sizes, thus causing the surface of the light emitting touchpad device 1 to bulge. Such non-ideal issue is usually referred to as "drumlins". To minimize "drumlins", in one embodiment, air discharging blocks 100 (see FIG. 7) can be disposed to achieve an air discharging effect after the reflective plate 70 and the circuit board 10 are bound together.

Figure 7:
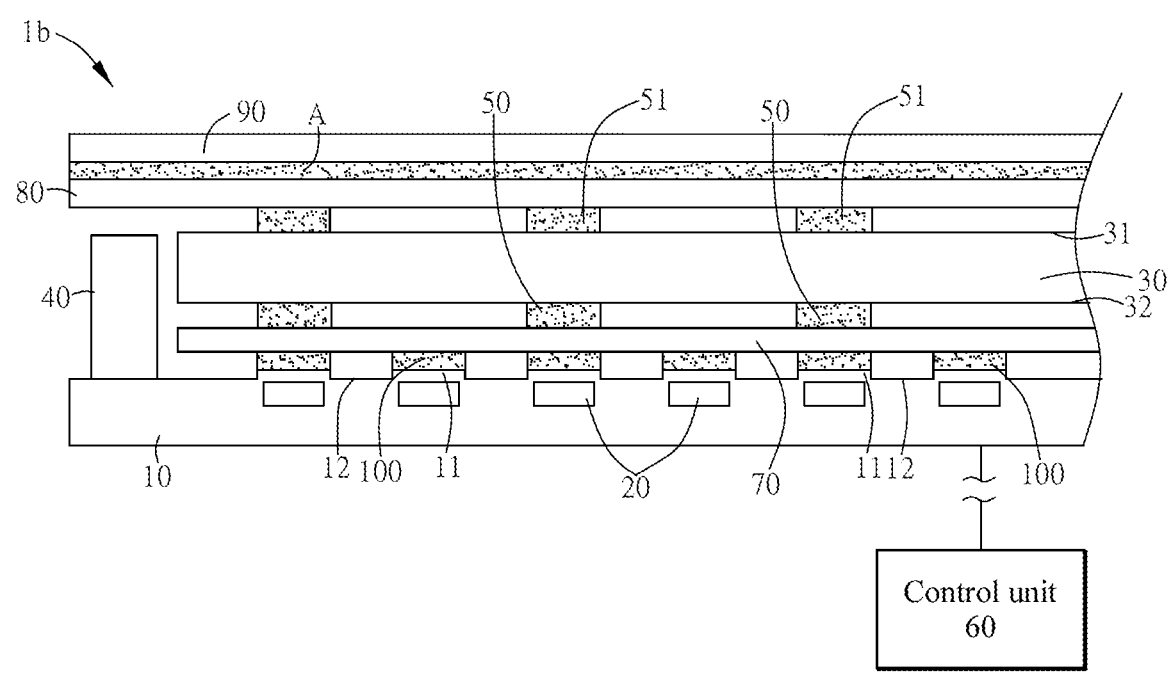
FIG. 7 is a schematic partial sectional view of a light emitting touchpad device according to yet another embodiment of the present disclosure.

FIG. 7 shows a schematic partial sectional view of a light emitting touchpad device according to yet another embodiment of the present disclosure. Referring to FIG. 7, a light emitting touchpad device 1b of this embodiment differs from the light emitting touchpad device 1 of the foregoing embodiment in that the light emitting touchpad device 1b further includes a plurality of air discharging blocks 100. The air discharging blocks 100 are disposed between the reflective plate 70 and the circuit board 10, and are respectively located at the protrusions 11. Further, the air discharging blocks 100 can be flexible blocks formed by solidified glue for connecting the circuit board 10 with the reflective plate 70. Specifically, while the light emitting touchpad device 1b is being manufactured, an adhesive, such as glue, which becomes flexible after solidifying can be applied onto the protrusions 11 of the circuit board 10, and then the air discharging blocks 100 are formed after the glue is solidified. In other words, the circuit board 10 and the reflective plate 70 are connected by the air discharging blocks 100 that are disposed at the protrusions 11 of the circuit board 10. The design of the air discharging blocks 100 reliefs the recesses 12 from being dead corners where air gathers, and further thoroughly discharges redundant air through the channels formed by the vacant spaces between the recesses 12 and the reflective plate 70, even when a large amount of air is contained during the binding procedure of the reflective plate 70 and the circuit board 10, thereby achieving an air discharging function and preventing the light emitting touchpad device 1b from "drumlins".

Figure 8:
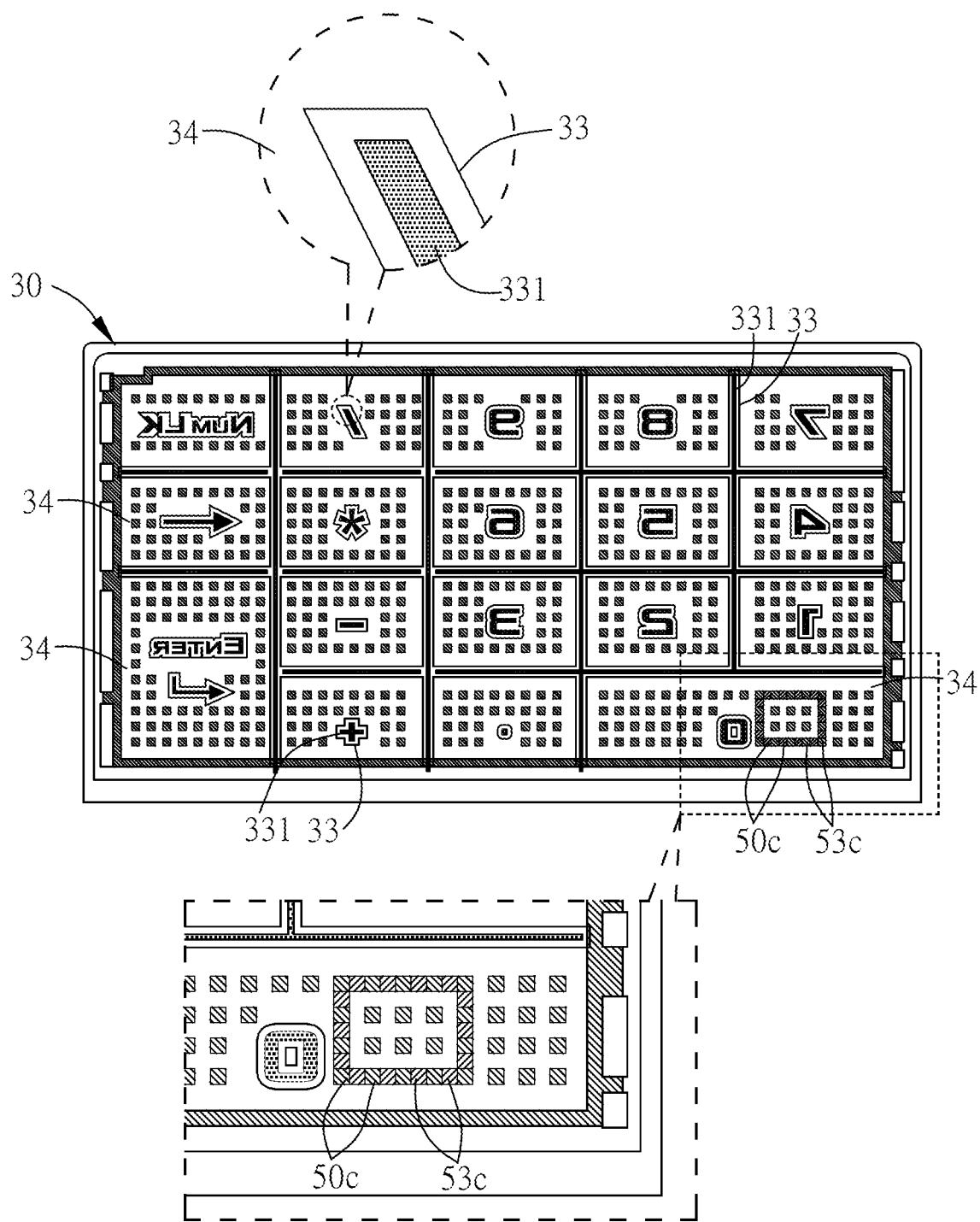
FIG. 8 is a schematic bottom view of a light guiding plate, first spacing blocks and filling blocks of a light emitting touchpad device according to further another embodiment of the present disclosure.

FIG. 8 shows a schematic bottom view of a light guiding plate, first spacing blocks and filling blocks of a light emitting touchpad device according to further another embodiment of the present disclosure. As shown in FIG. 8, a light emitting touchpad device (e.g., the foregoing embodiments, see FIG. 4, FIG. 6 or FIG. 7) further includes at least one filling block 53c. The filling block 53c is disposed in a gap between two adjacent second first blocks 50c, and connects the two adjacent first spacing blocks 50c. Similarly, the filling block 53c is also a flexible block formed by solidified glue, and the filling block 53c and the first spacing blocks 50c can be integrally produced to form a flexible strip from glue. For the areas that require specially reinforced adhesion, the filling block 53c can be additionally disposed, so as to achieve a stronger adhesion effect. In general, the overall quantity of the filling blocks 53c adopted within the light emitting touchpad device would be obviously less than the overall quantity of the first spacing blocks 50c. Thus, it is ensured that the total distributed area of the first spacing blocks 50c and the filling block 53c is still less than the area of glue applied in full range, so as to improve the efficiency of light emission of the light emitting touchpad device.

In conclusion, the light emitting touchpad device according to the present disclosure includes a plurality of first spacing blocks disposed on a light guiding plate and located in nil-light spot areas. Besides, a distance between the geometric centers of two adjacent first spacing blocks is a second length, and a spacing distance between the two adjacent first spacing blocks is a third length. In other words, the first spacing blocks are arranged in a manner of intervals in the nil-light areas of the light guiding plate, such that a loss of light energy can be reduced, thereby achieving an effect of enhancing an overall efficiency of light emission of the light emitting touchpad device.

Further, in some embodiments, by designing the spacing distance between two adjacent first spacing blocks (the third length) to be less than a diameter of a cylindrical metal test rod (a fourth length) or a maximum dimension of a surface of an open end of a non-cylindrical metal test rod (another fourth length), or by designing the distance between the geometric centers of two adjacent first spacing blocks (the second length) to be less than twice the distance between the geometric centers of two adjacent sensing elements (the first length), the effect of enhancing the overall efficiency of light emission of the light emitting touchpad device and preventing touch control system from misjudgment can be simultaneously achieved.

It should be noted that, the numerous embodiments above are examples for illustration purposes, and the claims set forth by the present disclosure should be accorded with the appended claims and are not to be limited by the embodiments above.

What is claimed is:

1. A light emitting touchpad device, comprising:
   a circuit board;
   a plurality of sensing elements, disposed on the circuit board, wherein a distance between geometric centers of adjacent two of the sensing elements is a first length;
   a light guiding plate, disposed above the circuit board, comprising a plurality of light spot areas, a plurality of nil-light spot areas, a bottom surface and a top surface, wherein a plurality of light spots are disposed in the light spot areas, no light spots are disposed in the nil-light spot areas, the bottom surface faces the circuit board, and the top surface is located on one side opposite to the bottom surface;
   a light emitting component, disposed adjacent to the light guiding plate, emitting light toward the light guiding plate;
   a plurality of first spacing blocks, disposed on the bottom surface of the light guiding plate, located in each of the plurality of nil-light spot areas, wherein each of the plurality of light spot areas is separated apart from one another by one of the plurality of nil-light spot areas, wherein a distance between geometric centers of adjacent two of the first spacing blocks is a second length, and a spacing distance between adjacent two of the first spacing blocks is a third length, wherein the spacing distance can make the light do total inner reflection in the light guiding plate; and
   a control unit, electrically connected to the sensing elements and the light emitting component.

2. The light emitting touchpad device according to claim 1, wherein the light spots in a part of the at least one light spot areas among the light spot areas are arranged in a specific pattern, and the specific pattern is used for identification by a user.

3. The light emitting touchpad device according to claim 1, further comprising:
   a plurality of second spacing blocks, the first spacing blocks being disposed on the bottom surface, the second spacing blocks being disposed on the top surface, wherein a distance between geometric centers of adjacent two of the second spacing blocks is the second length, and a spacing distance between adjacent two of the second spacing blocks is the third length.

4. The light emitting touchpad device according to claim 3, wherein the geometric center of any one of the second spacing blocks is aligned with the geometric center of one of the first spacing blocks.

5. The light emitting touchpad device according to claim 1, wherein the geometric center of any one of the first spacing blocks is aligned with the geometric center of one of the sensing elements.

6. The light emitting touchpad device according to claim 5, wherein the second length is less than or equal to twice of the first length.

7. The light emitting touchpad device according to claim 5, wherein the third length is less than a fourth length, and the fourth length is a diameter of a cylindrical test rod or a maximum dimension of a surface of an open end of a non-cylindrical test rod.

8. The light emitting touchpad device according to claim 1, further comprising:
   a reflective plate, disposed between the circuit board and the light guiding plate, wherein the first spacing blocks are located between the light guiding plate and the reflective plate and support the light guiding plate.

9. The light emitting touchpad device according to claim 8, the circuit board further comprising a plurality of protrusions, the light emitting touchpad device further comprising:
a plurality of air discharging blocks, disposed between the reflective plate and the circuit board, the air discharging blocks respectively located at the protrusions.

10. The light emitting touchpad device according to claim 3, further comprising:
a black mask, disposed above the light guiding plate, wherein the second spacing blocks are located between the black mask and the light guiding plate and support the black mask; and
a contact plate, disposed above the black mask.

11. The light emitting touchpad device according to claim 1, wherein each of the first spacing blocks is a flexible block formed by solidified glue.

12. The light emitting touchpad device according to claim 1, further comprising:
at least one filling block, disposed in a gap between adjacent two of the first spacing blocks and connecting the adjacent two of the first spacing blocks, wherein the at least one filling block is a flexible block formed by solidified glue.

13. A backlight module, comprising:
a circuit board;
a light guiding plate, comprising a plurality of light spot areas and a plurality of nil-light spot areas;
a plurality of light spots, disposed in the light spot areas, and the nil-light spot areas without the light spots;
a reflective plate, reflecting the light that refracted from the bottom of the light guiding plate back into the light guiding plate;
a plurality of first spacing blocks, disposed between the reflective plate and the light guiding plate, and only located in each of the plurality of nil-light spot areas, wherein each of the plurality of light spot areas is separated apart from one another by one of the plurality of nil-light spot areas, wherein a sum of the areas of the first spacing blocks is smaller than the nil-light spot areas;
a gap, disposed between two of the first spacing blocks, wherein the two first spacing blocks are adjacent, wherein the gap can make the light do total inner reflection in the light guiding plate; and
a light emitting component, disposed on the circuit board, emitting light toward the light spot areas.

14. The backlight module according to claim 13, wherein the light guiding plate and the reflective plate respectively comprise a first opening and a second opening, the first opening and the second opening correspondingly forming a hole for accommodating the light emitting component.

15. The backlight module according to claim 14, the first opening and the second opening, respectively located adjacent to a first side edge of the light guiding plate and a second side edge of the reflective plate, wherein the first side edge and the second side edge corresponding up and down.

16. The backlight module according to claim 13, wherein the light emitted by the light emitting component reaches the light spot areas, and a part of the light is guided toward the top surface of the light guiding plate by the plurality of light spots.

17. The backlight module according to claim 13, wherein the plurality of first spacing blocks have stickiness, the reflective plate and the light guiding plate are connected by the first spacing blocks.

18. A backlight module, comprising:
a light guiding plate, comprising a plurality of light spot areas and a plurality of nil-light spot areas;
a plurality of light spots, disposed in the light spot areas;
a reflective plate, reflecting the light that refracted from the bottom of the light guiding plate back into the light guiding plate; and
a plurality of first spacing blocks, disposed between the reflective plate and the light guiding plate, and only connect with each of the plurality of nil-light spot areas, wherein each of the plurality of light spot areas is separated apart from one another by one of the plurality of nil-light spot areas;
wherein the plurality of first spacing blocks change the inner reflection of the nil-light spot areas which connected with the plurality of first spacing blocks,
wherein a spacing distance between adjacent two of the first spacing blocks can make the light do total inner reflection in the light guiding plate.

19. The backlight module according to claim 18, wherein there is little or no light pass through the top surface of the light-guiding plate from the nil-light spot areas.

20. The backlight module according to claim 18, the plurality of light spots which guide a part of the light toward the top surface of the light guiding plate.

* * * * *